US007327583B2

(12) United States Patent
Nelson et al.

(10) Patent No.: US 7,327,583 B2
(45) Date of Patent: Feb. 5, 2008

(54) ROUTING POWER AND GROUND VIAS IN A SUBSTRATE

(75) Inventors: Jerimy Nelson, Fort Collins, CO (US); Mark D. Frank, Longmont, CO (US); Peter Shaw Moldauer, Wellington, CO (US); Karl Bois, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 102 days.

(21) Appl. No.: 10/939,654

(22) Filed: Sep. 13, 2004

(65) Prior Publication Data

US 2006/0055022 A1    Mar. 16, 2006

(51) Int. Cl.
*H01R 12/16*     (2006.01)
*H05K 1/11*      (2006.01)
(52) U.S. Cl. .............. 361/794; 361/780; 174/255; 174/262; 174/260
(58) Field of Classification Search ............ 174/255, 174/262, 260; 361/780, 794
See application file for complete search history.

(56) References Cited

U.S. PATENT DOCUMENTS

| 6,440,770 | B1 | 8/2002 | Banerjee et al. |
| 6,620,728 | B2 | 9/2003 | Lin |
| 6,707,145 | B2 | 3/2004 | Pollock et al. |
| 6,885,098 | B2* | 4/2005 | Weekly ............ 257/700 |

* cited by examiner

*Primary Examiner*—Dean A. Reichard
*Assistant Examiner*—Ivan Carpio

(57) ABSTRACT

A method for routing vias in a multilayer substrate is disclosed. One embodiment of a method may comprise providing a multilayer substrate with an internal bond surface having a plurality of internal bond pads and an external bond surface with a plurality of external bond pads. A plurality of power vias and ground vias may be routed from a first redistribution layer between the internal bond surface and the external bond surface to a second redistribution layer between the first redistribution layer and the external bond surface based on a via pattern. The via pattern may comprise routing a power via and a ground via adjacent one another spaced apart at a distance that is substantially equal to a minimum routing pitch associated with the multilayer substrate.

16 Claims, 4 Drawing Sheets

ROUTING POWER AND GROUND VIAS IN A SUBSTRATE

BACKGROUND

Controlled collapse chip connection (C4) or flip-chip technology has been successfully used for interconnecting high I/O (input/output) count and area array solder bumps on silicon chips to base ceramic chip carriers, for example alumina carriers. In C4 technology or flip chip packaging, one or more integrated circuit chips are mounted above a single or multiple layer ceramic (MLC) substrate or board to internal connecting fingers or pad (C4 pads), and the internal bond pads on the chip(s) are electrically or mechanically connected to corresponding external lands or pads on the other substrate by a plurality of electrical connections, such as solder bumps, referred to as a ball grid array (BGA).

In MLC packages, a ceramic substrate is the platform upon which chips, passive components, protective lids, and thermal enhancement hardware are attached. Wiring patterns within the substrate carrier define escape paths in single chip modules (SCMs) and multichip modules (MCMs), transforming the tight I/O pitch at the die level of the chips to a workable pitch at the board level. The wiring pattern also establishes the modules' power distribution network. Vertical metal vias provide interconnections between the various layers within the MLC. C4 pads can be directly soldered onto MLC vias, providing low inductance, and direct feed to power and ground planes.

Routing of signal lines through a ceramic substrate begins at a die/package interface where signals and power escape the pin field of a given die. The package includes internal routing layers which couple the external landing pads (or ball grid array) to internal landing pads coupled to the die. The internal routing typically contains separate layers for ground, power and signal lines. In many BGA designs, over one half of the internal bond pads are associated with power and ground connections. As linewidths of vias continue to decrease and chip speeds continue to increase, the inductance associated with power and ground loops due to the routing of power and ground signals from the package to the die becomes increasingly problematic.

SUMMARY

One embodiment of the present invention may comprise a method for routing vias in a multilayer substrate. The method may comprise providing a multilayer substrate with an internal bond surface having a plurality of internal bond pads and an external bond surface with a plurality of external bond pads. A plurality of power vias and ground vias may be routed from a first redistribution layer between the internal bond surface and the external bond surface to a second redistribution layer between the first redistribution layer and the external bond surface based on a via pattern. The via pattern may comprise routing a power via and a ground via adjacent one another spaced apart at a distance that is substantially equal to a minimum routing pitch associated with the multilayer substrate.

Another embodiment may comprise a multilayer ceramic (MLC) substrate having an internal bond surface with a plurality of internal bond pads and an external bond surface with a plurality of external bond pads. The MLC may comprise a first redistribution layer disposed between the internal bond surface and the external bond surface and a second redistribution layer disposed between the first redistribution layer and the external bond surface. A plurality of power and ground vias may be routed from the first redistribution layer to the second redistribution layer according to a power and ground via pattern. The power and ground via pattern may comprise an array of power and ground vias, wherein each row of the array includes a first ground via disposed adjacent a first power via, a second power via disposed adjacent the first power via, and a second ground via disposed adjacent the second power via.

Another embodiment may comprise a multilayer ceramic (MLC) substrate having an internal bond surface with a plurality of internal bond pads and an external bond surface with a plurality of external bond pads. The MLC may comprise a first redistribution layer disposed between the internal bond surface and the external bond surface and a second redistribution layer disposed between the first redistribution layer and the external bond surface. A plurality of power and ground vias may be routed from the first redistribution layer to the second redistribution layer according to a power and ground via pattern. The power and ground via pattern may comprise an array of power and ground vias, wherein each row of the array includes a first power via disposed adjacent a first side of a ground via, and a second power via disposed adjacent a second side of the ground via, such that the first side is opposite the second side.

DETAILED DESCRIPTION

This disclosure relates generally to routing power and ground vias in a multilayer substrate (e.g., multilayer ceramic substrate). The power and ground vias can provide coupling connections from an integrated circuit or die to a printed circuit board (PCB) or other layered structure. The multilayer substrate includes an internal bond surface for bonding internal bond pads to an integrated circuit of a die and an external bond surface for bonding external bond pads to a printed circuit board (PCB) or other multilayer substrate. The power and ground vias are routed based on a power and ground via pattern from a first redistribution layer (e.g., a first power layer, a second power layer) disposed between the internal bond surface and the external bond surface, to a second redistribution layer disposed between the first redistribution layer and the external bond surface. The power and ground via pattern reduce inductance associated with power and ground loops through the multilayer substrate.

A "redistribution layer" as used in this disclosure refers to a layer in which the vias can be jogged and/or grouped together employing conductive lines, so that the vias can be moved to other locations on the redistribution layer, or so that the number of vias can be reduced. A redistribution layer is typically a power layer, a ground layer or a signal layer. "Jogging" as used in this disclosure refers to a via that includes a bend or transition that is substantially transverse to the via direction between layers. For example, a vertical metal via that provides interconnections between layers is typically jogged horizontally along a "redistribution layer" to a location spaced from the vertical metal via. A new via is provided which then can continue vertically to one or more additional layers spaced below the redistribution layer, or the via can be grouped together with one or more other vias to reduce the number of vias for routing to additional layers.

Figure 1:
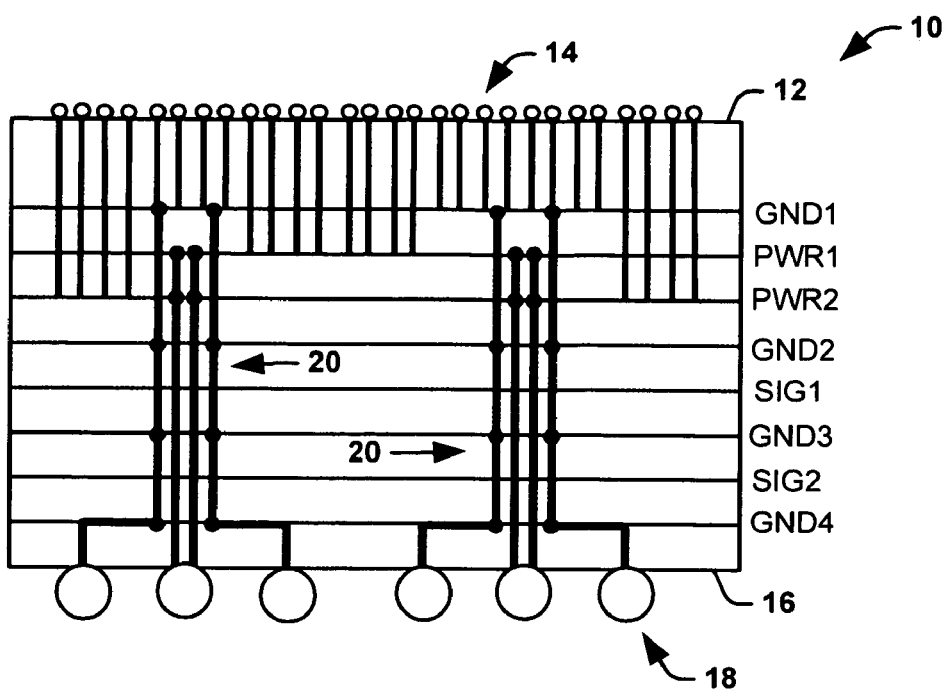
FIG. 1 illustrates a cross-sectional view of an embodiment of a portion of a multilayer substrate having a first power and ground via pattern.

FIG. 1 illustrates a cross-sectional view of a portion of a multilayer substrate 10 having a first power and ground via pattern. The vias can include power vias, ground vias, and signal vias. The multilayer substrate 10 can be a multilayer ceramic substrate, printed circuit board, semiconductor structure, or other multilayer structure for routing signals therethrough. The multilayer substrate 10 includes a plurality of redistribution layers such as power layers, ground layers and signal layers. The plurality of power layers, ground layers and signal layers can be interposed between one or more dielectric layers. The multilayer substrate 10 includes an internal bond surface 12 having a plurality of internal bond pads 14 for bonding the multilayer substrate 10 to pins of an integrated circuit associated with a circuit die. The multilayer substrate 10 also includes an external bond surface 16 having a plurality of external bond pads 18 for coupling the substrate to a printed circuit board or other multilayer device. The external bond pads 18 can be a ball grid array (BGA), a pin grid array (PGA) or land grid array (LGA).

For illustrative purposes, the multilayer substrate 10 includes a first ground layer (GND1), a first power layer (PWR1), a second power layer (PWR2), a second ground layer (GND2), a first signal layer (SIG1), a third ground layer (GND3), a second signal layer (SIG2), and a fourth ground layer (GND4). A plurality of ground vias extend from the internal bond pads 14 from the internal bond surface 12 of the multilayer substrate 10 to the first ground layer. At the first ground layer, the ground vias can be redistributed employing a plurality of conductive lines. A plurality of power vias extend from the internal bond pads 14 from the internal bond surface 12 of the multilayer substrate 10 to the first power layer. At the first power layer, the power vias can be redistributed employing a plurality of conductive lines. A plurality of power vias extend from the internal bond pads 14 from the internal bond surface 12 of the multilayer substrate 10 to the second power layer. At the second power layer, the power vias can be redistributed employing a plurality of conductive lines. The first and second power layers can be associated with different or a same power supply. A plurality of signal vias (not shown) can extend from the internal bond pads 14 from the internal bond surface 12 of the multilayer substrate 10 to the first signal layer. The plurality of signal vias can be redistributed at the first signal layer.

The power, ground and signal vias are redistributed at respective redistribution layers or intermediate layers to mitigate via bulge at the top surface (internal bond surface) of the multilayer substrates. Via bulge is caused by the difference in expansion/contraction of the typical conductive paste and the typical dielectric material encompassing the vias and etch lines during firing. Therefore, vias which protrude from the surface and that go into the substrate through many layers will tend to form hills on the carrier's mounting surface, and will produce via-bulge. Accordingly, vias are jogged every six to eight layers to mitigate via bulge. Once the power and ground signals are redistributed at respective power and ground layers, the power and ground signals can be routed through the multilayer substrate 10.

As illustrated in FIG. 1, a via pattern 20 is employed for routing power and ground signals through intermediate layers of the multilayer substrate 10 from a first redistribution layer (e.g., a power layer (PWR1, PWR2)) space apart from the internal bond surface 12 to a second redistribution layer (e.g., a ground layer (GND4)) that is a layer that is in close proximity (e.g., the closest ground layer) to the external bond surface 16. The power and ground vias are coupled from the second redistribution layer to the external bond pads 18 of the multilayer substrate 10. The via pattern includes placing or wrapping ground vias around power vias for a substantial portion of the routing length of the power and ground vias through the multilayer substrate 10. The ground vias can be spaced apart from the power vias at a distance that is substantially equal to the minimum pitch associated with the multilayer substrate 10. The minimum pitch is the minimum distance required between vias based on the requirements associated with a given multilayer substrate. The placement of ground vias around the power vias at a distance that is substantially equal to the minimum pitch minimizes the inductance between the power and ground vias to mitigate deleterious effects associated with power and ground loops caused by routing power and ground signals through the multilayer substrate 10 to a respective die coupled to the internal bond pads 14 of the internal bond surface 12.

In the example of FIG. 1, a two×N array of power vias are routed from a first power layer through the multilayer substrate 10 to the external bond pads 18 disposed on the external bond surface 16 of the multilayer substrate 10, where N is an integer that is equal to or greater than one. Alternatively, or additionally, the power vias can be routed from the second power layer through the multilayer substrate 10 to the external bond pads 18 disposed on the external bond surface 16 of the multilayer substrate 10. A two×N array of ground vias are routed on adjacent sides of the two×N array of power vias from the first power layer to the fourth ground layer, such that a ground via is routed adjacent and alongside a respective power via. At the fourth ground layer, the ground vias are jogged to locations disposed above corresponding external ground pads 18. The ground vias are then routed to the assigned external ground pads 18 at the external bond surface 16 of the multilayer substrate 10. It is to be appreciated that the ground vias can be jogged at layers disposed above the fourth ground layer, such as the second signal layer or the third ground layer.

Figure 2:
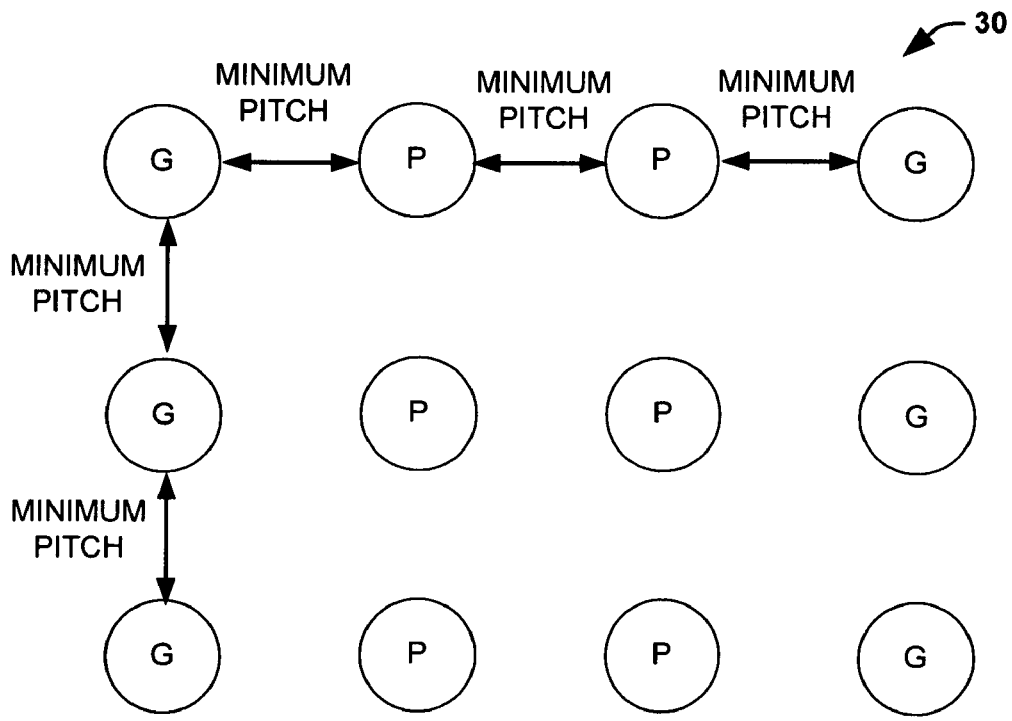
FIG. 2 illustrates an embodiment of a power and ground via pattern associated with a block of power and ground vias.

FIG. 2 illustrates a power and ground via pattern 30 associated with a block of power and ground vias. The power and ground via pattern 30 includes a 2×3 array of power vias. The 2×3 array of power vias includes a first column of three power vias adjacent a second column of power vias. Power vias in the first column can be separated from power vias of the second column by a minimum pitch associated with the multilayer substrate. It is to be appreciated that each power and ground via can be separated from adjacent power and ground vias by a distance substantially equal to the minimum pitch associated with the multilayer substrate. A 2×3 array of ground vias surrounds the 2×3 array of power vias, such that the 2×3 array of power vias are disposed between the 2×3 array of ground vias. A first column of three ground vias is adjacent the first column of three power vias separated by a minimum pitch associated with the multilayer substrate. A second column of three ground vias is adjacent the second column of three power vias separated by a minimum pitch associated with the multilayer substrate. The first and second column of ground vias wrap or surround the power vias. Each row of the power and ground via pattern 30 includes a first ground via disposed adjacent a first power via, a second power via disposed adjacent the first power via, and a second ground via disposed adjacent the second power via. It is to be appreciated that each power and ground via can be separated from adjacent power and ground vias by a distance substantially equal to the minimum pitch associated with the multilayer substrate.

The power and ground via pattern 30 provides for minimizing the inductance associated with power and ground loops through the multilayer substrate. The 2×3 array of power vias can be routed directly to an external power pad pad associated with the external bond surface of the multilayer substrate if the pitch of the external bond pad can encompass the area of the 2×3 array of power vias. The first row of ground vias can be jogged at a redistribution layer spaced apart from the external bond surface in a first direction away from the power vias above an external ground pad, and the second row of ground vias can be jogged at the redistribution layer spaced apart from the external bond surface in a second direction away from the power via above an external ground pad. The first direction is in a direction that is substantially opposite the second direction. The redistribution layer can be a closest ground layer to the external bond surface of the multilayer substrate.

It is to be appreciated that in certain multilayer substrate designs, the pitch of the external bond pads may be too small to allow for the connection of multiple power vias from the first power layer directly to the external bond pads. Therefore, the power vias may be joined into a single power via at a redistribution layer spaced apart from the external bond surface.

Figure 3:
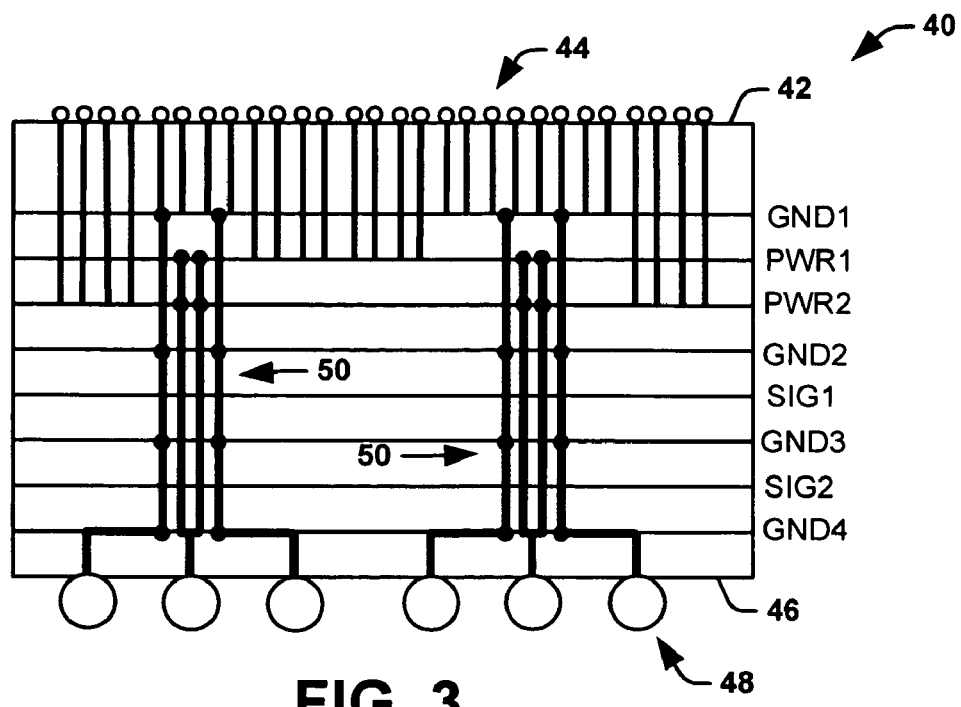
FIG. 3 illustrates a cross-sectional view of an embodiment of a portion of a multilayer substrate having the first power and ground via pattern with power vias joined at a redistribution layer.

FIG. 3 illustrates a cross-sectional view of a portion of a multilayer substrate 40 having a first power and ground via pattern with power vias joined at a redistribution layer. The multilayer substrate 40 includes an internal bond surface 42 with a plurality of internal bond pads 44 for bonding the multilayer substrate 40 to pins of an integrated circuit associated with a circuit die. The multilayer substrate 40 also includes an external bond surface 46 with a plurality of external bond pads 48 for coupling the substrate to a printed circuit board or other multilayer device.

The multilayer substrate 40 includes a first ground layer (GND1), a first power layer (PWR1), a second power layer (PWR2), a second ground layer (GND2), a first signal layer (SIG1), a third ground layer (GND3, a second signal layer (SIG2), and a fourth ground layer (GND4). A plurality of ground vias extend from the internal bond pads 44 at the internal bond surface 42 of the multilayer substrate 40 to the first ground layer. At the first ground layer, the ground vias can be redistributed employing a plurality of conductive lines. A plurality of first power vias extend from the internal bond pads 44 at the internal bond surface 42 of the multilayer substrate 40 to the first power layer. At the first power layer, the first power vias can be redistributed employing a plurality of conductive lines. A plurality of second power vias extend from the internal bond pads 44 at the internal bond surface 42 of the multilayer substrate 40 to the second power layer. At the second power layer, the second power vias can be redistributed employing a plurality of conductive lines.

As illustrated in FIG. 3, a via pattern 50 is employed similar to the via pattern illustrated in FIGS. 1-2 for routing power and ground signals through intermediate layers of the multilayer substrate from a first redistribution layer (e.g., a power layer space apart from the internal bond surface 42) to a second redistribution layer (e.g., a closest ground layer to the external bond surface 46). The via pattern includes placing or wrapping ground vias around power vias for a substantial portion of the routing length of the power and ground vias through the multilayer substrate. The ground vias can be spaced apart from the power vias at a distance that is substantially equal to a minimum pitch associated with the multilayer substrate 40. A two×N array of power vias are routed from a first power layer through the multilayer substrate 40 to the fourth ground layer, where N is an integer that is equal to or greater than one. At the fourth ground layer, the power vias associated with a given via pattern are joined into a single via disposed above an external power pad 48. The single power vias are then routed to the respective external power pad 48. It is to be appreciated that the array of power vias can be joined into a single power via at other layers other than the fourth ground layer, such as the second signal layer or the third ground layer.

A two×N array of ground vias are routed on adjacent sides of two×N array of power vias from the first power layer to the fourth ground layer, such that a ground via is routed adjacent and alongside each respective power via. At the fourth ground layer, the ground vias are jogged to locations disposed above corresponding external ground pads 48. The ground vias are then routed to the assigned external ground pads 48 at the external bond surface 46 of the multilayer substrate 40. It is to be appreciated that the ground vias can be jogged at layers disposed above the fourth ground layer, such as the second signal layer or the third ground layer.

Figure 4:
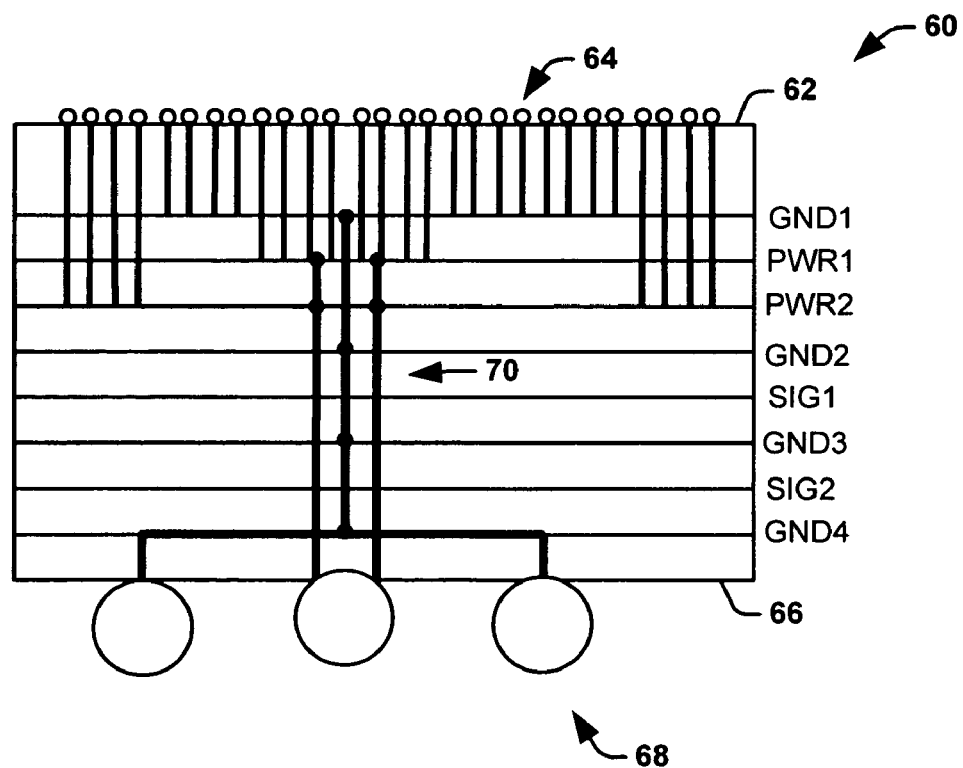
FIG. 4 illustrates a cross-sectional view of an embodiment of a portion of a multilayer substrate having a second power and ground via pattern.

FIG. 4 illustrates a cross-sectional view of a portion of a multilayer substrate 60 having a second power and ground via pattern. The vias can include power vias, ground vias, and signal vias. The multilayer substrate 60 includes an internal bond surface 62 having a plurality of internal bond pads 64 for bonding the multilayer substrate 60 to pins of an integrated circuit associated with a circuit die. The multilayer substrate 60 also includes an external bond surface 66 having a plurality of external bond pads 68 for coupling the substrate to a printed circuit board or other multilayer device.

The multilayer substrate 60 includes a first ground layer (GND1), a first power layer (PWR1), a second power layer (PWR2), a second ground layer (GND2), a first signal layer (SIG1), a third ground layer (GND3, a second signal layer (SIG2), and a fourth ground layer (GND4). A plurality of ground vias extend from the internal bond pads 64 at the internal bond surface 62 of the multilayer substrate 60 to the first ground layer. At the first ground layer, the ground vias can be redistributed employing a plurality of conductive lines. A plurality of first power vias extend from the internal bond pads 64 at the internal bond surface 62 of the multilayer substrate 60 to the first power layer. At the first power layer, the first power vias can be redistributed employing a plurality of conductive lines. A plurality of second power vias extend from the internal bond pads 64 at the internal bond surface 62 of the multilayer substrate 60 to the second power layer. At the second power layer, the second power vias can be redistributed employing a plurality of conductive lines.

As illustrated in FIG. 4, a via pattern 70 is employed for routing power and ground signals through intermediate layers of the multilayer substrate from a first redistribution layer, such as a power layer space apart from the internal bond surface 62 to a second redistribution layer (e.g., a ground layer) close to or near the external bond surface 66. The via pattern 70 includes placing or wrapping power vias around ground vias for a substantial portion of the routing length of the power and ground vias through the multilayer substrate 60. The power vias can be spaced apart from the ground vias at a distance substantially equal to the minimum pitch associated with the multilayer substrate 60. It is to be appreciated that each power and ground via can be separated from adjacent power and ground vias by a distance substantially equal to the minimum pitch associated with the multilayer substrate.

In the example of FIG. 4, a two×N array of power vias are routed from a first power layer through the multilayer substrate 60 to external bond pads 68 disposed on the external bond surface 66 of the multilayer substrate 60, where N is an integer that is equal to or greater than one. Alternatively, or additionally, the power vias can be routed from the second power layer through the multilayer substrate 60 to external bond pads 68 disposed on an external bond surface 66 of the multilayer substrate 60. A one×N array of ground vias are routed between power vias with the power vias being on adjacent sides of the ground vias from the first power layer to the fourth ground layer, such that a first power via is routed adjacent and alongside a first side of a respective ground via, and second power via is routed adjacent and alongside a second side of the respective ground via. The first side of the ground via is opposite the second side of the ground via. At the fourth ground layer, the ground vias are jogged to locations disposed above corresponding external ground pads 68. The ground vias are then routed to the assigned external ground pads 68 at the external bond surface 66 of the multilayer substrate 60. It is to be appreciated that the ground vias can be jogged at layers disposed above the fourth ground layer, such as the second signal layer or the third ground layer.

Figure 5:
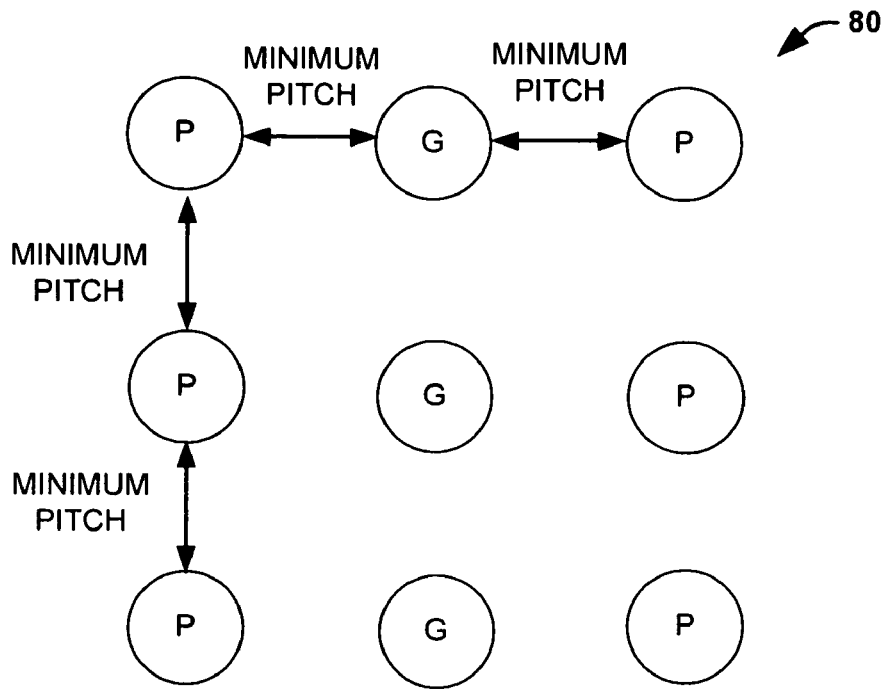
FIG. 5 illustrates another embodiment of a power and ground via pattern associated with a block of power and ground vias.

FIG. 5 illustrates another power and ground via pattern 80 associated with a block of power and ground vias. The via pattern 80 includes 1×3 array of ground vias disposed between a 2×3 array of power vias. A first column of power vias are disposed adjacent a first side of a column of ground vias and a second column of power vias are disposed adjacent a second side of the column of ground vias. The power vias can be separated from adjacent ground vias by a distance that is substantially equal to the minimum pitch associated with the multilayer substrate. The 2×3 array of power vias surrounds the 1×3 array of ground vias. The power and ground via pattern 70 comprising an array of power and ground vias wherein each row of the array includes a first power via disposed adjacent a first side of a ground via, and a second power via disposed adjacent a second side of the ground via, wherein the first side of the ground via is opposite the second side of the ground via. It is to be appreciated that each power and ground via can be separated from adjacent power and ground vias by a distance substantially equal to the minimum pitch associated with the multilayer substrate.

The power and ground via pattern 80 eliminates an extra column of ground vias, which adds more routing space to the substrate, while still providing a low impedance power and ground loop path. The power and ground via pattern 80 provides for minimizing the inductance associated with a power and ground loop through the multilayer substrate. The 2×3 array of power vias can be routed directly to an external bond pad associated with the external bond surface of the multilayer substrate if the pitch of the external bond pad can encompass the area of the 2×3 array of power vias. The ground vias can be jogged at a redistribution layer spaced apart from the external bond surface in a first direction and/or second direction away from the power vias above an external ground pad. The ground vias can then be routed to a respective ground pad from the redistribution layer.

It is to be appreciated that in certain multilayer substrate designs, the pitch of the external bond pads may be too small to allow for the connection of multiple power vias from the first power layer to the external bond pads. Therefore, the power vias may be joined into a single power via at a redistribution layer spaced apart from the external bond surface.

Figure 6:
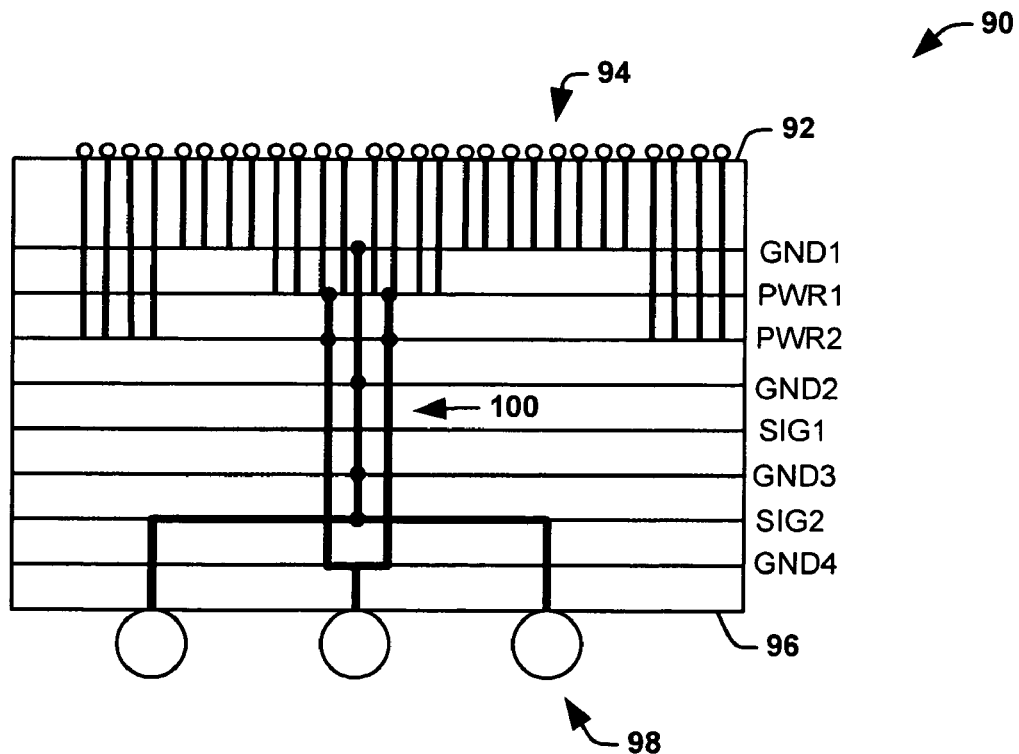
FIG. 6 illustrates a cross-sectional view of an embodiment of a portion of a multilayer substrate having the second power and ground via pattern with power vias joined at a redistribution layer.

FIG. 6 illustrates a cross-sectional view of a portion of a multilayer substrate 90 having a second power and ground via pattern with power vias joined at a redistribution layer. The multilayer substrate 90 includes a plurality of internal bond pads 94 disposed on an internal bond surface 92 for bonding the multilayer substrate 90 to pins of an integrated circuit associated with a circuit die. The multilayer substrate 90 also includes a plurality of external bond pads 98 disposed on an external bond surface 96 for coupling the substrate 90 to a printed circuit board or other multilayer device.

The multilayer substrate 90 includes a first ground layer (GND1), a first power layer (PWR1), a second power layer (PWR2), a second ground layer (GND2), a first signal layer (SIG1), a third ground layer (GND3, a second signal layer (SIG2), and a fourth ground layer (GND4). A plurality of ground vias extend from the internal bond pads 94 at the internal bond surface 92 of the multilayer substrate 90 to the first ground layer. At the first ground layer, the ground vias can be redistributed employing a plurality of conductive lines. A plurality of first power vias extend from the internal bond pads 94 at the internal bond surface 92 of the multilayer substrate 90 to the first power layer. At the first power layer, the first power vias can be redistributed employing a plurality of conductive lines. A plurality of second power vias extend from the internal bond pads 94 at the internal bond surface 92 of the multilayer substrate 90 to the second power layer. At the second power layer, the second power vias can be redistributed employing a plurality of conductive lines.

As illustrated in FIG. 6, a via pattern 100 is employed similar to the via pattern illustrated in FIGS. 4-5 for routing power and ground signals through intermediate layers of the multilayer substrate 90 from a first redistribution layer, such as a power layer spaced apart from the internal bond surface 92 to a second redistribution layer (e.g., a ground layer) close to or near to the external bond surface 96 of the multilayer substrate 90. The via pattern 100 includes placing or wrapping power vias around ground vias for a substantial portion of the routing length of the power and ground vias through the multilayer substrate. The ground vias can be spaced apart from the power vias at a distance that is substantially equal to a minimum pitch associated with the multilayer substrate. A two×N array of power vias are routed from a first power layer through the multilayer substrate 90 to the fourth ground layer, where N is an integer that is equal to or greater than one. At the fourth ground layer, the array of power vias associated with a given via pattern 100 are joined into a single via disposed above a respective external power pad 98. The single power via is routed to an external bond pad. It is to be appreciated that the array of power vias can be joined into a single power via at other layers other than the fourth ground layer, such as the second signal layer or the third ground layer, as long as the joining layer is different than the jogging layer of the ground vias.

A one×N array of ground vias are routed in between the two×N array of power vias from the first power layer to the second signal layer, such that a ground via is routed adjacent, alongside and in between a pair of power vias. At the second signal layer, the ground vias are jogged to locations disposed above corresponding external ground pads 98. The ground vias are then routed to the assigned external ground pads 98 at the external bond surface 96 of the multilayer substrate 90. It is to be appreciated that the ground vias can be jogged at layers disposed above the second signal layer, such as the first signal layer or the third ground layer.

Figure 7:
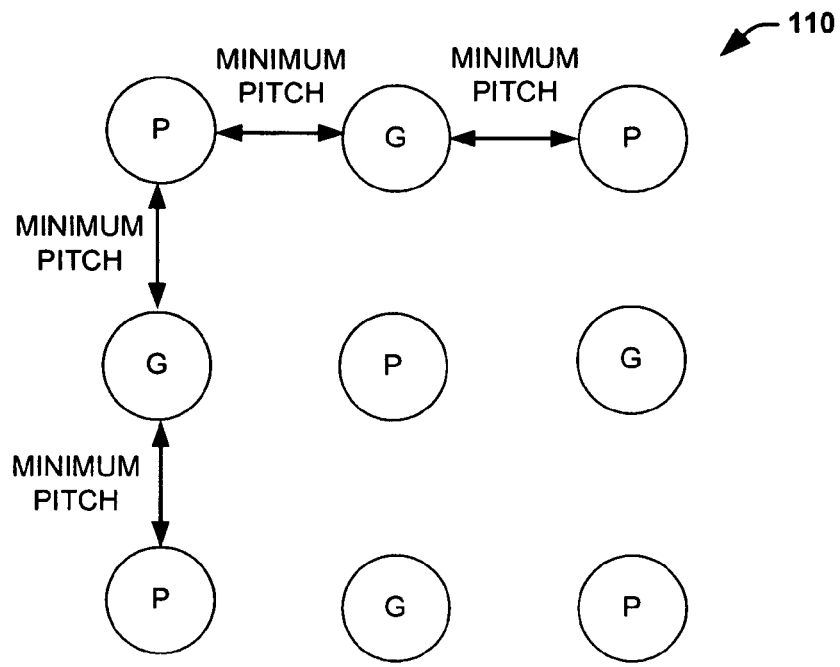
FIG. 7 illustrates yet another embodiment of a power and ground via pattern associated with a block of power and ground vias.

FIG. 7 illustrates yet another power and ground via pattern 110 associated with a block of power and ground vias. The power and ground via pattern 110 includes a 3×3 array of interleaved ground and power vias. The power and ground via pattern 110 can include a M×N array of interleaved power and ground vias, where N and M are integers that are greater than or equal to one. A first row of vias includes a ground via disposed between a pair of power vias. A second row of vias includes a power via disposed between a pair of ground vias. A third row of vias includes a ground via disposed between a pair of power vias. The via pattern arrangement provides that each ground via be adjacent at least two power vias and each power via be adjacent at least two ground vias. The power and ground via pattern 110 provides for an impedance power ground loop path that is lower than the patterns illustrated in FIGS. 2 and 5 with a tradeoff in routing complexity. It is to be appreciated that each power and ground via can be separated from adjacent power and ground vias by a distance substantially equal to the minimum pitch associated with the multilayer substrate.

Figure 8:
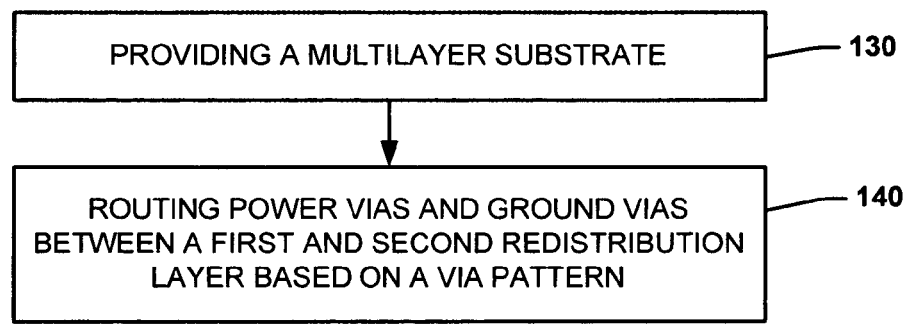
FIG. 8 illustrates an embodiment of a method for routing vias in a multilayer substrate.

FIG. 8 illustrates a methodology for routing vias in a multilayer substrate. At 130 a multilayer substrate is provided with an internal bond surface having a plurality of internal bond pads and an external bond surface with a plurality of external bond pads. At 140, a plurality of power vias and ground vias are routed from a first redistribution layer between the internal bond surface and the external bond surface to a second redistribution layer between the first redistribution layer and the external bond surface based on a via pattern. The via pattern can comprise routing a power via and a ground via adjacent one another spaced apart at a distance that is substantially equal to a minimum routing pitch associated with the multilayer substrate.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A multilayer ceramic (MLC) substrate having an internal bond surface with a plurality of internal bond pads and an external bond surface with a plurality of external bond pads, the MLC substrate comprising:
   a first redistribution layer disposed between the internal bond surface and the external bond surface;
   a second redistribution layer disposed between the first redistribution layer and the external bond surface; and
   a plurality of power and ground vias routed from the first redistribution layer to the second redistribution layer according to a power and ground via pattern, the power and ground via pattern comprising an array of power and ground vias wherein each row of the array includes a first ground via disposed adjacent a first power via, a second power via disposed adjacent the first power via, and a second ground via disposed adjacent the second power via.

2. The substrate of claim 1, wherein first ground via is spaced apart from the first power via and the second ground via is spaced apart from the second power via at a distant that is substantially equal to the minimum routing pitch associated with the multilayer substrate.

3. The substrate of claim 1, wherein each of the power vias associated with a given power and ground via pattern are coupled to a same respective external power pad.

4. The substrate of claim 1, wherein each of the power vias associated with a given powder and ground via pattern are joined at the second redistribution layer and a single power via from the second redistribution layer is coupled to a respective external power pad.

5. The substrate of claim 1, wherein the first ground vias of each row of the array are jogged at the second redistribution layer in a first direction to be coupled to at least one external ground pad, and the second ground vias of each row of the array are jogged at the second redistribution layer in a second direction opposite the first direction to be coupled to at least one other external ground pad.

6. The substrate of claim 1, wherein the first redistribution layer is one of a first power layer and a second power layer spaced apart from the internal bond surface, and the second redistribution layer is a ground layer that is a closest ground layer to the external bond surface.

7. A multilayer ceramic (MLC) substrate having an internal bond surface with a plurality of internal bond pads and an external bond surface with a plurality of external bond pads, the MLC substrate comprising:
   a first redistribution layer disposed between the internal bond surface and the external bond surface;
   a second redistribution layer disposed between the first redistribution layer and the external bond surface; and
   a plurality of power and ground vias routed from the first redistribution layer to the second redistribution layer according to a power and ground via pattern, the power and ground via pattern comprising an array of power and ground vias wherein each row of the array includes a first power via disposed adjacent a first side of a ground via, and a second power via disposed adjacent a second side of the ground via, the first side being opposite the second side, each of the power vias associated with a given power and ground via pattern being joined at the second redistribution layer, and a single power via from the second redistribution layer being coupled to a respective external power pad.

8. The substrate of claim 7, wherein first power via is spaced apart from the ground via and the second power via is spaced apart from the ground via at a distant that is substantially equal to the minimum routing pitch associated with the multilayer substrate.

9. The substrate of claim 7, wherein each of the power vias associated with a given power and ground via pattern are coupled to a same respective external power pad.

10. The substrate of claim 7, wherein the ground vias associated with a given via pattern are jogged at a third distribution layer disposed between the first redistribution layer and the second redistribution layer to be coupled to at least one external ground pad.

11. The substrate of claim 7, wherein the first redistribution layer is one of a first power layer and a second power layer spaced apart from the internal bond surface, and the second redistribution layer is a ground layer that is a closest ground layer to the external bond surface.

12. A multilayer ceramic (MLC) substrate having an internal bond surface with a plurality of internal bond pads and an external bond surface with a plurality of external bond pads the MLC substrate comprising:
   a first redistribution layer disposed between the internal bond surface and the external bond surface;
   a second redistribution layer disposed between the first redistribution layer and the external bond surface; and
   a plurality of power and wound vias routed from the first redistribution layer to the second redistribution layer according to a power and ground via pattern, the power and wound via pattern comprising an array of power and ground vias wherein each row of the array includes a first power via disposed adjacent a first side of a ground via, and a second power via disposed adjacent a second side of the ground via, the first side being opposite the second side, the first redistribution layer being a power layer spaced apart from the internal bond surface, and the second redistribution layer being a ground layer that is a closest ground layer to the external bond surface.

13. The substrate of claim 12, wherein first power via is spaced apart from the ground via and the second power via is spaced apart from the ground via at a distant that is substantially equal to the minimum routing pitch associated with the multilayer substrate.

14. The substrate of claim 12, wherein each of the power vias associated with a given power and ground via pattern are coupled to a same respective external power pad.

15. The substrate of claim 12, wherein each of the power vias associated with a given power and ground via pattern are joined at the second redistribution layer and a single power via from the second redistribution layer is coupled to a respective external power pad.

16. The substrate of claim 15, wherein the ground vias associated with a given via pattern are jogged at a third distribution layer disposed between the first redistribution layer and the second redistribution layer to be coupled to at least one external ground pad.

* * * * *

UNITED STATES PATENT AND TRADEMARK OFFICE
CERTIFICATE OF CORRECTION

PATENT NO. : 7,327,583 B2 Page 1 of 1
APPLICATION NO. : 10/939654
DATED : February 5, 2008
INVENTOR(S) : Jerimy Nelson et al.

It is certified that error appears in the above-identified patent and that said Letters Patent is hereby corrected as shown below:

In column 10, line 21, in Claim 2, delete "distant" and insert -- distance --, therefor.

In column 10, line 21, in Claim 4, delete "powder" and insert -- power --, therefor.

In column 11, line 1, in Claim 8, delete "distant" and insert -- distance --, therefor.

In column 11, line 20, in Claim 12, after "pads" insert -- , --.

In column 11, line 25, in Claim 12, delete "wound" and insert -- ground --, therefor.

In column 11, line 27, in Claim 12, delete "wound" and insert -- ground --, therefor.

In column 12, line 11, in Claim 13, delete "distant" and insert -- distance --, therefor.

Signed and Sealed this

Tenth Day of June, 2008

JON W. DUDAS
*Director of the United States Patent and Trademark Office*